United States Patent
Kawabata

(10) Patent No.: US 12,362,292 B2
(45) Date of Patent: Jul. 15, 2025

(54) SEMICONDUCTOR DEVICE

(71) Applicant: Mitsubishi Electric Corporation, Tokyo (JP)

(72) Inventor: Daisuke Kawabata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 506 days.

(21) Appl. No.: 17/507,485

(22) Filed: Oct. 21, 2021

(65) Prior Publication Data

US 2022/0223545 A1 Jul. 14, 2022

(30) Foreign Application Priority Data

Jan. 14, 2021 (JP) ................................. 2021-004053

(51) Int. Cl.
*H10F 19/80* (2025.01)
*H01L 23/00* (2006.01)
(Continued)

(52) U.S. Cl.
CPC .......... *H01L 23/564* (2013.01); *H01L 23/053* (2013.01); *H01L 23/10* (2013.01); *H01L 25/072* (2013.01)

(58) Field of Classification Search
CPC ..... H01L 23/564; H01L 23/053; H01L 23/10; H01L 25/072; H01L 24/32; H01L 24/45; H01L 24/48; H01L 24/73; H01L 2224/32225; H01L 2224/45124; H01L 2224/45147; H01L 2224/48137;
(Continued)

(56) References Cited

U.S. PATENT DOCUMENTS 5,973,258 A * 10/1999 Shiotsuka ............. H01L 31/048
136/251
6,230,895 B1 * 5/2001 Laube ............... H01L 21/67386
206/454
(Continued)

FOREIGN PATENT DOCUMENTS

| JP | H11-177006 A | 7/1999 |
|---|---|---|
| JP | 2014-150204 A | 8/2014 |
| WO | 2019/239615 A1 | 12/2019 |

OTHER PUBLICATIONS

An Office Action; "Notice of Reasons for Refusal," mailed by the Japanese Patent Office on Nov. 14, 2023, which corresponds to Japanese Patent Application No. 2021-004053 and is related to U.S. Appl. No. 17/507,485; with English language translation.
(Continued)

*Primary Examiner* — Christopher A Johnson
(74) *Attorney, Agent, or Firm* — Studebaker Brackett PLLC

(57) ABSTRACT

Object is to reduce the number of paths through which moisture enters in a semiconductor device. A semiconductor device includes a semiconductor element, a case housing the semiconductor element, a sealing material filled in the case, a low moisture permeable sheet covering the sealing material, and a lid covering an opening of the case. The low moisture permeable sheet is made of a low moisture permeable material having moisture permeability of $1 \text{ g/m}^2 \times 24$ Hr or less. The low moisture permeable sheet is interposed, at the peripheral edge thereof, between the case and the lid.

10 Claims, 19 Drawing Sheets

(51) Int. Cl.
*H01L 23/053* (2006.01)
*H01L 23/10* (2006.01)
*H01L 25/07* (2006.01)

(58) Field of Classification Search
CPC . H01L 2224/48139; H01L 2224/48227; H01L 2224/48472; H01L 2224/73265; H01L 2924/19107
USPC .......................................................... 257/678
See application file for complete search history.

(56) References Cited

U.S. PATENT DOCUMENTS

| | | | |
|---|---|---|---|
| 2015/0076545 A1* | 3/2015 | Nakatani | H01L 33/486 438/118 |
| 2016/0336252 A1* | 11/2016 | Houzouji | H01L 23/24 |
| 2019/0109059 A1* | 4/2019 | Ohara | H01L 23/3121 |
| 2021/0082778 A1 | 3/2021 | Kaji et al. | |

OTHER PUBLICATIONS

An Office Action mailed by China National Intellectual Property Administration on Oct. 18, 2024, which corresponds to Chinese Patent Application No. 202210017267.6 and is related to U.S. Appl. No. 17/507,485; with English language translation.

\* cited by examiner

F I G. 8
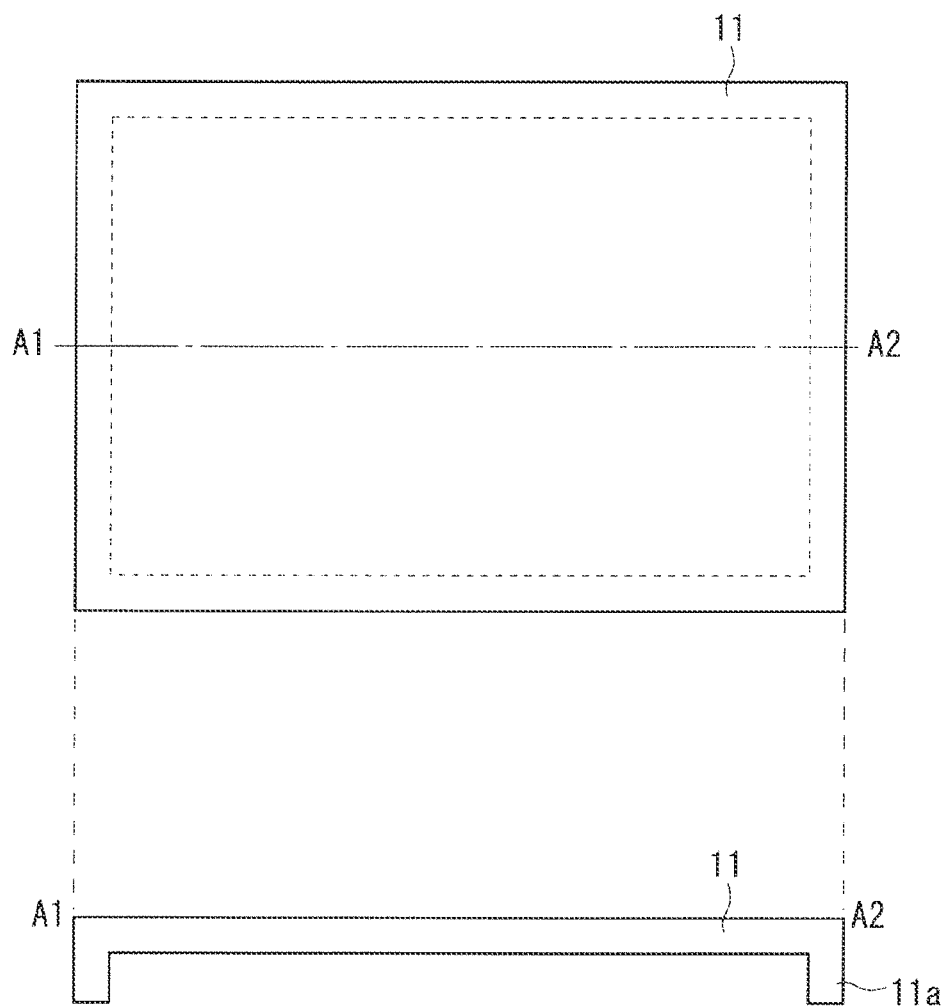

SEMICONDUCTOR DEVICE

BACKGROUND OF THE INVENTION

Field of the Invention

The present disclosure relates to a semiconductor device.

Description of the Background Art

A semiconductor device for power control having a structure in which semiconductor elements are sealed in a case is widely known. High heat resistance and high insulation engineering plastics such as polyphenylene sulfide (PPS) are used in many cases as the material of the case. Silicone based gel or epoxy resin is used as the sealing material to be filled in the case. Further, the case is provided with a lid for protecting the sealing material, and the material of the lid is typically the same as the material of the case. Hereinafter, the semiconductor elements and the semiconductor device for power control may be referred to as a "power semiconductor element" and a "power semiconductor device", respectively.

With the shift to SiC devices for power semiconductor devices and the improvement of the temperature characteristics of Si devices, the market demand for power semiconductor devices is surging, and, for example, the humidity absorption tolerance, which has been used as a reference test, is being required as a guarantee of use. As a humidity absorption tolerance test, Temperature Humidity Bias (THB) test specified in JEITA ED-4701 102A is adopted, in which, for example, a storage test is conducted in which a specified voltage is applied in an environment of a temperature of 85° C. and a humidity of 85%.

As moisture permeation progresses in the power semiconductor device, the insulation resistance on the surface of the power semiconductor element and the surface of a highly insulating member such as an insulating substrate on which the power semiconductor element is mounted decreases, and this may shorten the life of the power semiconductor device. In particular, the termination portion of a power semiconductor element made of SiC is shrunk and is a portion to which a high electric field is applied; therefore, there is a considerable adverse effect due to the lowering of the insulation resistance of the termination portion from moisture absorption.

The main paths of moisture permeation and moisture absorption in the power semiconductor device having the above structure pass through the adhesive interface and the fitting portion of the case and the lid. For example, Japanese Patent Application Laid-Open No. 2014-150204 discloses a technique for arranging a sheet material on a sealing material of a semiconductor device in order to suppress intrusion of gas, moisture or the like, derived from the operating environment of the semiconductor device.

SUMMARY

In the technique of Japanese Patent Application Laid-Open No. 2014-150204, a gap is generated between the sheet material and the case, and there is a possibility that moisture may enter through the gap.

An object of the present disclosure is to suppress moisture from entering in the semiconductor device.

The semiconductor device includes a semiconductor element, a case housing the semiconductor element, a sealing material filled in the case in which the semiconductor element is housed, a first low moisture permeable sheet covering the sealing material, and a lid covering an opening of the case. The first low moisture permeable sheet is made of a low moisture permeable material having moisture permeability of 1 $g/m^2 \times 24$ Hr or less. A peripheral edge of the first low moisture permeable sheet is interposed between the case and the lid.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 8 is a top view and a cross-sectional view of a low moisture permeable sheet according to Embodiment 2;

DESCRIPTION OF THE PREFERRED EMBODIMENTS

Embodiment 1

Figure 1:
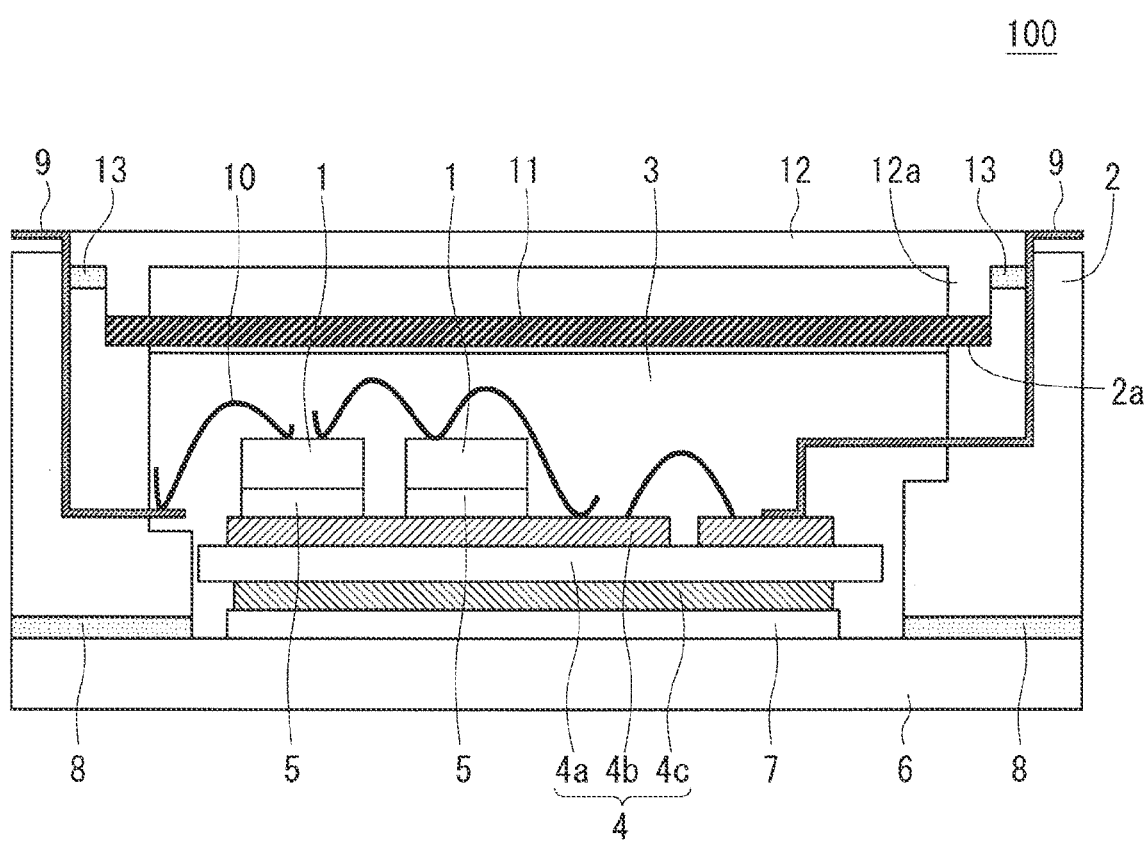
FIG. 1 is a schematic cross-sectional view of a semiconductor device according to Embodiment 1.

FIG. 1 is a schematic cross-sectional view of a semiconductor device 100 according to Embodiment 1. As illustrated in FIG. 1, the semiconductor device 100 is a power semiconductor device having a structure in which semiconductor elements 1 being power semiconductor elements are housed in a case 2 and sealed with a sealing material 3. Semiconductor elements 1 are Insulated Gate Bipolar Transistors (IGBT), Metal Oxide Semiconductor Field Effect Transistors (MOSFET) or the like formed of silicon (Si), silicon carbide (SiC), gallium nitride (GaN), or the like.

The semiconductor elements 1 are mounted on an insulating substrate 4, and the insulating substrate 4 is mounted on a base plate 6. The insulating substrate 4 is composed of an insulating layer 4a, a circuit pattern 4b formed on the upper surface of the insulating layer 4a, and a circuit pattern 4c formed on the lower surface of the insulating layer 4a. The semiconductor elements 1 are bonded to the circuit pattern 4b via the bonding materials 5, and the base plate 6 is bonded to the circuit pattern 4c via the bonding material 7.

There are no restrictions on the materials of the insulating layer 4a and the circuit patterns 4b and 4c. The insulating layer 4a may be composed of an inorganic ceramic material such as alumina ($Al_2O_3$), aluminum nitride (AlN), or silicon nitride ($Si_3N_4$). The circuit patterns 4b and 4c may be composed of, for example, copper or an alloy thereof, aluminum or an alloy thereof, and the like. As the bonding materials 5 and the bonding material 7, solder or a solder alloy made of lead (Pb), tin (Sn) or the like, or a sintered material made of nano-silver or nano-copper particles is used. The material of the bonding materials 5 and the material of the bonding material 7 may be the same or different from each other.

The material of the base plate 6 may be a metal material such as copper, aluminum, a copper-molybdenum alloy (CuMo), or a composite material such as a silicon carbide-aluminum composite material (AlSiC) or a silicon carbide-magnesium composite material (MgSiC).

The case 2 is also mounted on the base plate 6, and the case 2 is adhered to the base plate 6 using an adhesive 8 (second adhesive).

The case 2 incorporates electrodes 9 used for connection with the outside. The semiconductor elements 1, the circuit patterns 4b, and the electrodes 9 are connected via metal wires 10 or directly to form an electric circuit. As the material of the electrodes 9, for example, a metal mainly composed of copper (Cu) or an alloy thereof is typically used. And, a plating layer such as Ni may be provided on the surface of the electrode 9. As the material of the metal wires 10, aluminum (Al), copper (Cu), alloys thereof, or the like is used.

The sealing material 3 is filled in the case 2 and seals the semiconductor elements 1 and the insulating substrate 4 on which the semiconductor elements 1 are mounted. The material of the sealing material 3 is an insulating resin such as a silicone resin or an epoxy resin.

Figure 2:
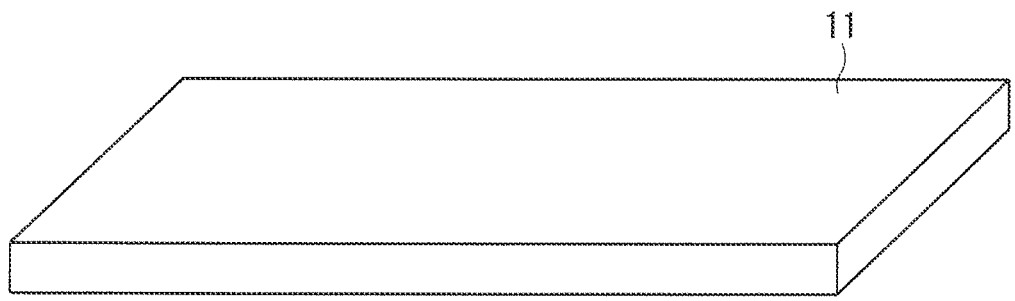
FIG. 2 is a perspective view of a low moisture permeable sheet according to Embodiment 1.

Further, a low moisture permeable sheet 11 (first low moisture permeable sheet) made of a low moisture permeable material is provided in the case 2 so as to cover the sealing material 3. In Embodiment 1, a flat plate-shaped low moisture permeable sheet 11 as illustrated in FIG. 2 is used. The low moisture permeable material constituting the low moisture permeable sheet 11 has low moisture and gas permeability, such as a fluororesin such as polytetrafluoroethylene (PTFE), and the moisture permeability thereof is 1 $g/m^2 \times 24$ Hr or less is desirable. The moisture permeability is defined by JIS Z 0208, "Humidity permeability test method for moisture-proof packaging material" and the like.

Further, in order to prevent the semiconductor device 100 from being enlarged in size, the thickness of the low moisture permeable sheet 11 is preferably 3 mm or less, and more preferably 1 mm or less. The low moisture permeable sheet 11 may be in contact with the upper surface of the sealing material 3.

The opening of the case 2 is closed by the lid 12, and the lid 12 is adhered to the case 2 using an adhesive 13 (first adhesive). As illustrated in FIG. 1, the peripheral edge of the low moisture permeable sheet 11 is interposed between the case 2 and the lid 12. The material of the case 2 and the lid 12 may be any material having electrical insulation, and may be formed of, for example, an epoxy resin or a polyphenylene sulfide (PPS) resin. Further, the adhesives 8 and 13 may be a typical silicone-based adhesive or may be made of a low moisture permeable material such as an acrylic resin.

Here, the structure formed by the case 2, the low moisture permeable sheet 11 and the lid 12 in the semiconductor device 100 of FIG. 1 will be described in detail. The lid 12 has a convex portion 12a having a shape fitted to the opening of the case 2, and the case 2 has a counterbore portion 2a on the peripheral edge of the opening. Therefore, when the convex portion 12a of the lid 12 is fitted into the opening of the case 2, the convex portion 12a and the counterbore portion 2a face each other. The low moisture permeable sheet 11 extends over the counterbore portion 2a of the case 2, and the peripheral edge of the low moisture permeable sheet 11 is interposed between the convex portion 12a and the counterbore portion 2a.

The adhesive 13 for adhering the case 2 and the lid 12 is arranged in a portion where the low moisture permeable sheet 11 is not interposed (the outer portions of the counterbore portion 2a and the convex portion 12a in FIG. 1), and the thickness direction of the adhesive 13 is the same as the thickness direction of the low moisture permeable sheet 11 in the portion where the low moisture permeable sheet 11 is interposed between the case 2 and the lid 12. Consequently, when the adhesive 13 is cured and shrunk, the counterbore portion 2a of the case 2 and the convex portion 12a of the lid 12 are attracted to each other, leading to the effect that the adhesion is strengthened between the counterbore portion 2a and the convex portion 12a and the low moisture permeable sheet 11 interposed therebetween can be obtained. In particular, if the low moisture permeable sheet 11 is made of an elastic material such as fluororesin, the low moisture permeable sheet 11 is elastically deformed and high adhesion between the counterbore portion 2a and the convex portion 12a is obtained.

According to the semiconductor device 100 of Embodiment 1, the sealing material 3 that seals the semiconductor elements 1 in the case 2 is covered with the low moisture permeable sheet 11 made of the low moisture permeable material, and the low moisture permeable sheet 11 is interposed between the case 2 and the lid 12, thereby making a gap less likely to be formed between the case 2 and the low moisture permeable sheet 11. Therefore, the number of paths through which moisture enters into the case 2 is reduced; therefore, moisture is prevented from entering the case 2, improving dampproofness of the semiconductor device 100. For example, even when a typical silicone-based adhesive (moisture permeability is about 10 $g/m^2 \times 24$ Hr to 100 g/m²×24 Hr) is used as the adhesive 13 for adhering the case 2 and the lid 12, a sufficient moisture-proof effect can be obtained. Further, the low moisture permeable sheet 11 provides the high moisture-proof effect; therefore, narrowing the width of the region to which the adhesive 13 is applied can contribute to the downsizing of the semiconductor device 100. In particular, when the power semiconductor element 1 is a SiC element, the termination portion thereof is shrunk and is a portion to which a high electric field is applied, and there is a considerable adverse effect due to the lowering of the insulation resistance of the termination portion from moisture absorption; therefore, the above effect is effective.

The surface of the low moisture permeable sheet 11 may be roughened by providing irregularities on the surface of the low moisture permeable sheet 11. By roughening the surface of the low moisture permeable sheet 11, the adhesion between the low moisture permeable sheet 11 and the sealing material 3 is improved, and further suppression of paths through which moisture enters from being created can be expected. The roughening method of the low moisture permeable sheet 11 may be a physical method or a chemical method. For example, a method of providing irregularities on the surface of the mold for molding the low moisture permeable sheet 11 can be conceived.

Here, a method of manufacturing the semiconductor device 100 will be described. First, the base plate 6, the bonding material 7, the insulating substrate 4, the bonding material 5 and the semiconductor elements 1 are stacked in this order, and the reflow is performed under reduced pressure or in a reducing gas atmosphere, and a thermal history of the melting temperature of the bonding material 5 and the bonding material 7 or higher is given, thereby bonding each member together. Next, wiring is performed between the semiconductor elements 1 or between the semiconductor element 1 and the insulating substrate 4 by ultrasonic bonding of the metal wires 10.

Subsequently, the adhesive 8 is linearly applied to the outer peripheral portion (adhesive portion with the case 2) of the base plate 6, the case 2 is placed on the adhesive 8, and the adhesive 8 is subjected to thermosetting, thereby gluing the base plate 6 and case 2 together. After that, the electrodes 9 incorporated in the case 2 and the insulating substrate 4 are bonded by ultrasonic bonding.

Figure 3:
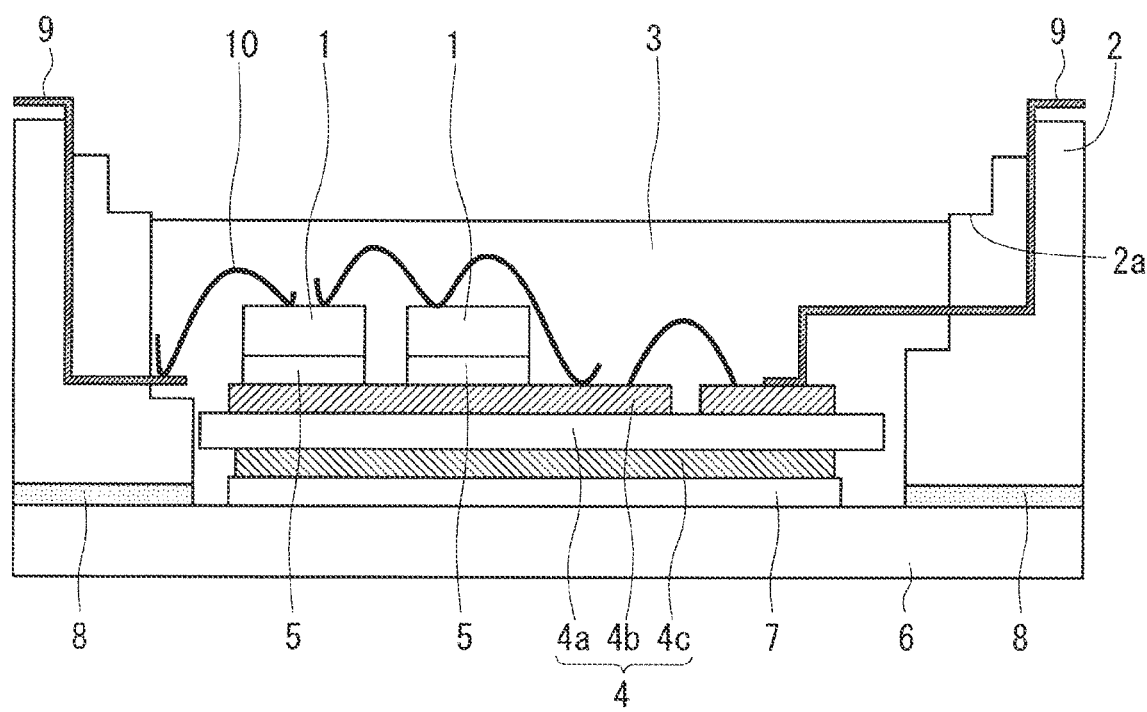
FIG. 3 is a schematic cross-sectional view illustrating a manufacturing process of the semiconductor device according to Embodiment 1.
Figure 4:
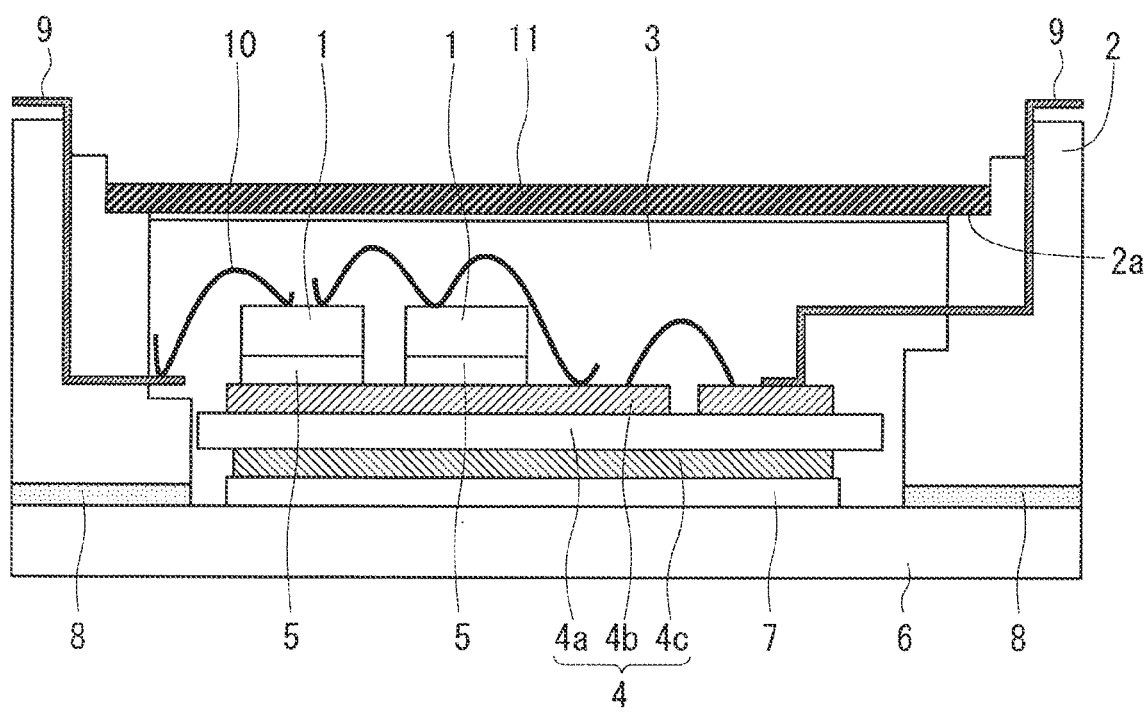
FIG. 4 is a schematic cross-sectional view illustrating a manufacturing process of the semiconductor device according to Embodiment 1.

Next, as illustrated in FIG. 3, the case 2 is filled with the sealing material 3, and the sealing material 3 is subjected to thermosetting using an oven or the like to seal the semiconductor elements 1. Then, as illustrated in FIG. 4, the sealing material 3 is covered with the low moisture permeable sheet 11. At this point, the peripheral edge of the low moisture permeable sheet 11 is placed on the counterbore portion 2a of the case 2.

Figure 5:
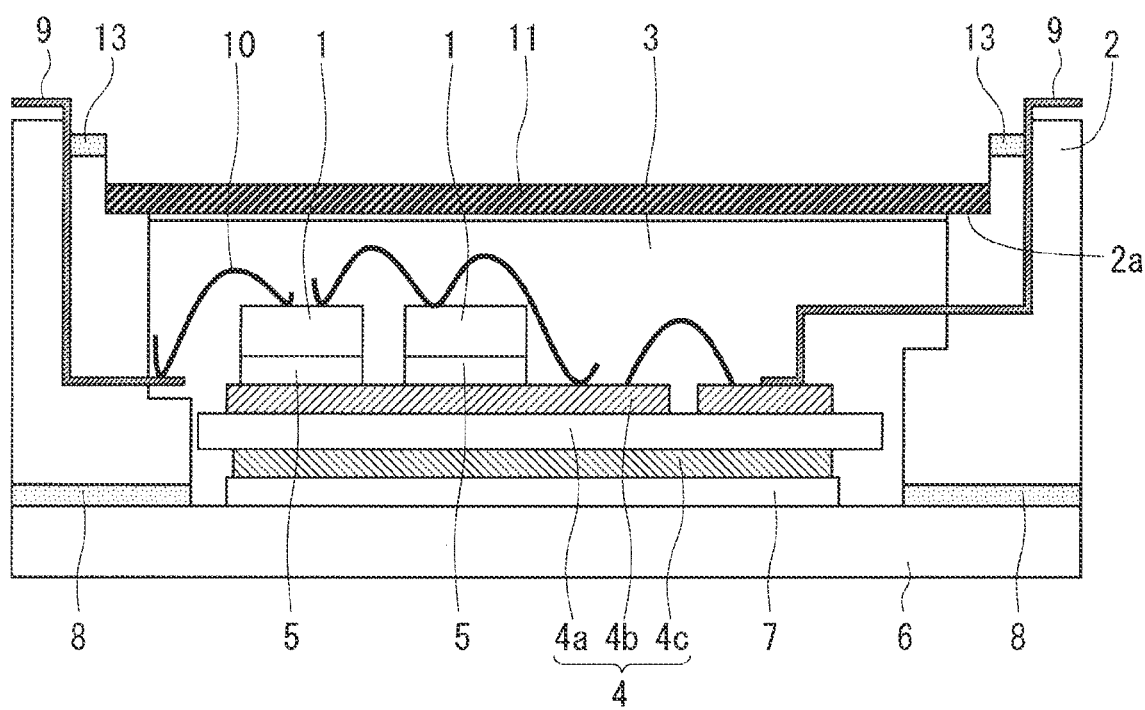
FIG. 5 is a schematic cross-sectional view illustrating a manufacturing process of the semiconductor device according to Embodiment 1.
Figure 6:
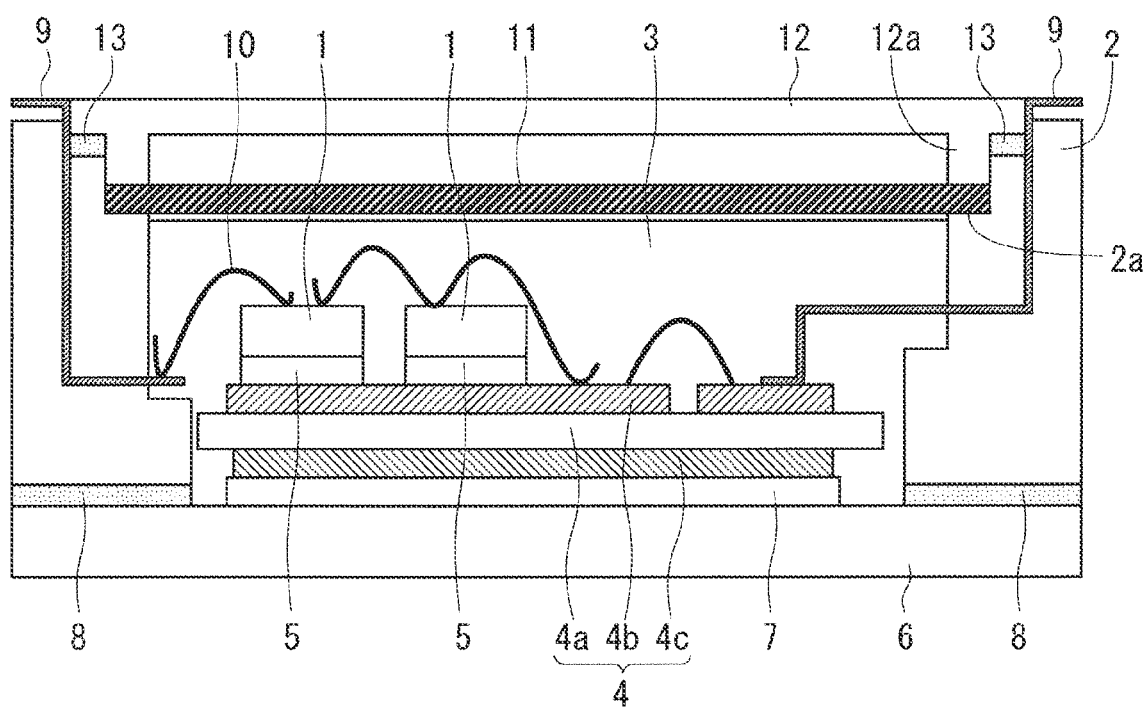
FIG. 6 is a schematic cross-sectional view illustrating a manufacturing process of the semiconductor device according to Embodiment 1.

Then, as illustrated in FIG. 5, the adhesive 13 is applied linearly or in a dotted manner to the edge of the case 2 (the adhesive portion with the lid 12). Then, as illustrated in FIG. 6, the convex portion 12a of the lid 12 is fitted into the opening of the case 2, and the opening of the case 2 is closed with the lid 12. At this point, the convex portion 12a of the lid 12 comes into contact with the upper surface of the peripheral edge of the low moisture permeable sheet 11. Then, the adhesive 13 is subjected to thermosetting to adhere the case 2 and the lid 12 together. When the adhesive 13 cures and shrinks, the counterbore portion 2a of the case 2 and the convex portion 12a of the lid 12 are attracted to each other; therefore, the adhesion is strengthened between the counterbore portion 2a and the convex portion 12a and the low moisture permeable sheet 11 interposed therebetween.

Through the above processes, the semiconductor device 100 illustrated in FIG. 1 is completed.

Embodiment 2

Figure 7:
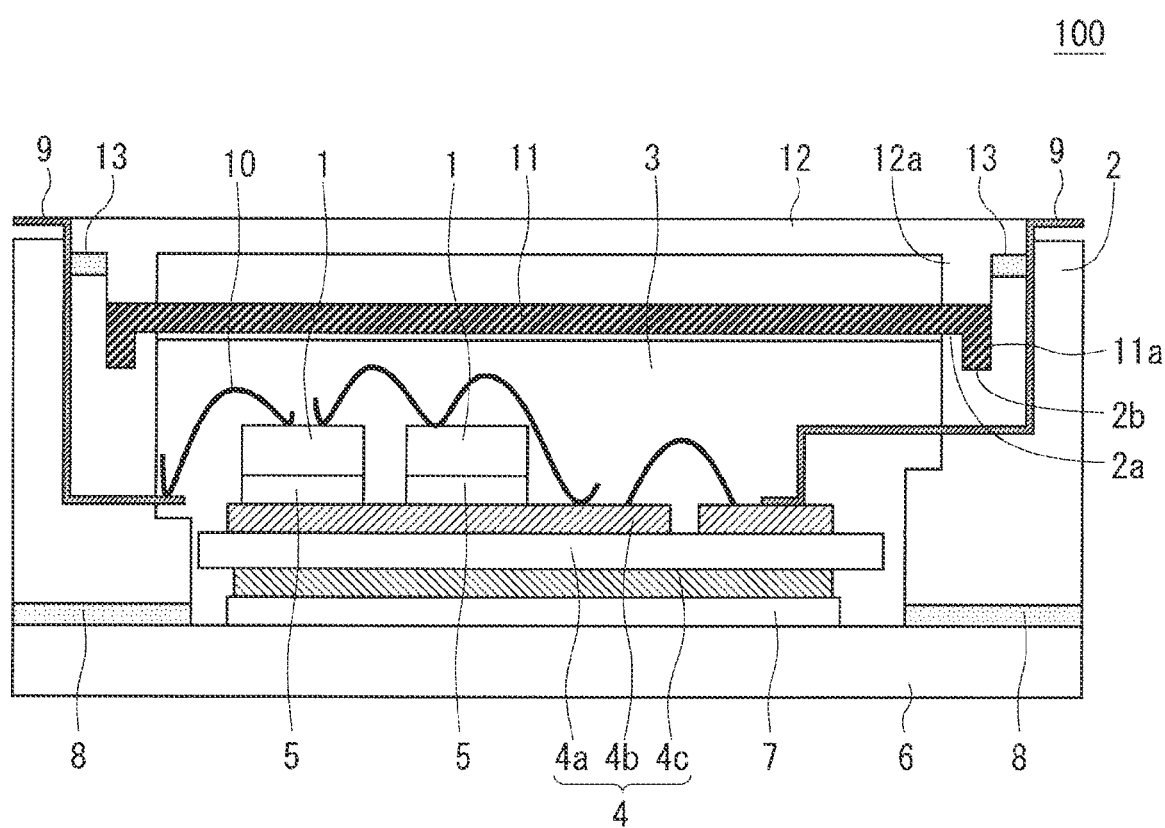
FIG. 7 is a schematic cross-sectional view of a semiconductor device according to Embodiment 2.

FIG. 7 is a schematic cross-sectional view of a semiconductor device according to Embodiment 2. FIG. 8 is a top view and a cross-sectional view of a low moisture permeable sheet 11 according to Embodiment 2. In Embodiment 2, a low moisture permeable sheet 11 has a convex portion 11a at a peripheral edge thereof, that is, a portion interposed between a case 2 and a lid 12, and the case 2 is provided with a groove 2b into which the convex portion 11a of the low moisture permeable sheet 11 is to be inserted.

Further, in Embodiment 2, the convex portion 11a is provided at the end portion of the low moisture permeability sheet 11; therefore, the end portion of the low moisture permeability sheet 11 is L-shaped in cross-sectional view (As illustrated in FIG. 8, the low moisture permeable sheet 11 is U-shaped when viewed in the entire cross section of the low moisture permeable sheet 11). Further, the groove 2b of the case 2 is provided in the counterbore portion 2a. Other configurations are the same as those in Embodiment 1 (FIG. 1).

Any method may be used as the method of providing the convex portion 11a on the low moisture permeable sheet 11. For example, the convex portion 11a may be formed by a mold for molding the low moisture permeable sheet 11, or the lower surface of the flat plate-shaped low moisture permeable sheet 11 as illustrated in FIG. 2 may be cut to form the convex portion. 11a.

According to the semiconductor device 100 of Embodiment 2, the positioning accuracy of the low moisture permeable sheet 11 with respect to the case 2 and the retention of the low moisture permeable sheet 11 are improved; therefore, in addition to the effect same as that of Embodiment 1, the effect that the humidity absorption tolerance of the semiconductor device 100 can be further improved can be obtained.

Embodiment 3

Figure 9:
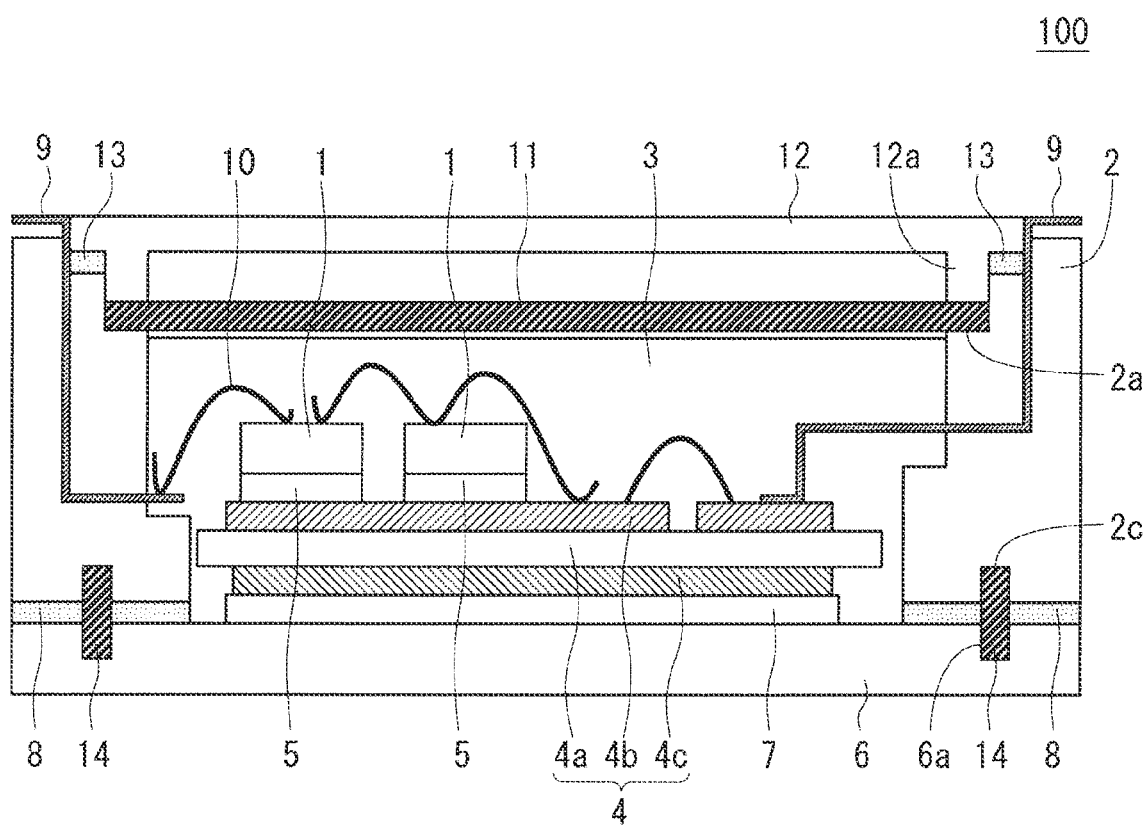
FIG. 9 is a schematic cross-sectional view of a semiconductor device according to Embodiment 3.
Figure 10:
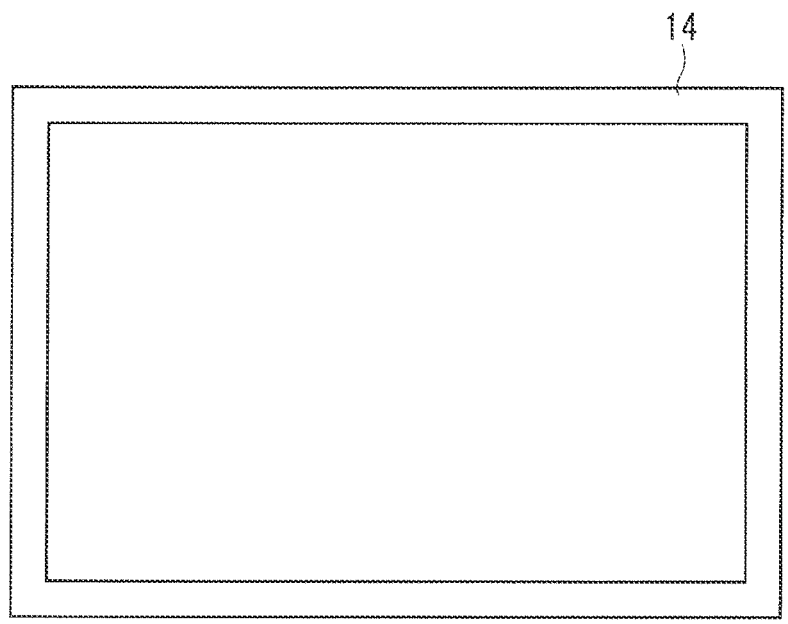
FIG. 10 is a top view of a low moisture permeable sheet according to Embodiment 3.

FIG. 9 is a schematic cross-sectional view of a semiconductor device 100 according to Embodiment 3. As illustrated in FIG. 9, in the semiconductor device 100 of Embodiment 3, a low moisture permeable sheet 14 (second low moisture permeable sheet) is provided at the adhesive interface between a case 2 and a base plate 6. The shape of the low moisture permeable sheet 14 is a frame shape in a plan view as illustrated in FIG. 10, and extends in the adhesive interface between the case 2 and the base plate 6 so as to surround a sealing material 3. The low moisture permeable material constituting the low moisture permeable sheet 14 may be the same as a low moisture permeable sheet 11 covering the sealing material 3, and the moisture permeability thereof is preferably 1 g/m²×24 Hr or less.

In order to prevent the semiconductor device 100 from being enlarged in size, the thickness of the low moisture permeable sheet 14 is preferably 3 mm or less, and more preferably 1 mm or less. Further, a plurality of frame-shaped low moisture permeable sheets 14 may be nested at the adhesive interface between the case 2 and the base plate 6. Further, in Embodiment 3, a groove 2c into which a part of the low moisture permeable sheet 14 is inserted is formed at the adhesive interface with the base plate 6 in the case 2, and a groove 6a into which a part of the low moisture permeable sheet 14 is inserted is also formed at the adhesive interface with the case 2 in the base plate 6 is formed. Therefore, the thickness of the low moisture permeable sheet 14 can be made larger than the thickness of the adhesive 8 that adheres the case 2 and the base plate 6 together. Further, the low moisture permeable sheet 14 extends inside the adhesive 8. That is, the adhesive 8 is provided on both sides of the low moisture permeable sheet 14. Other configurations are the same as those in Embodiment 1 (FIG. 1).

Figure 11:
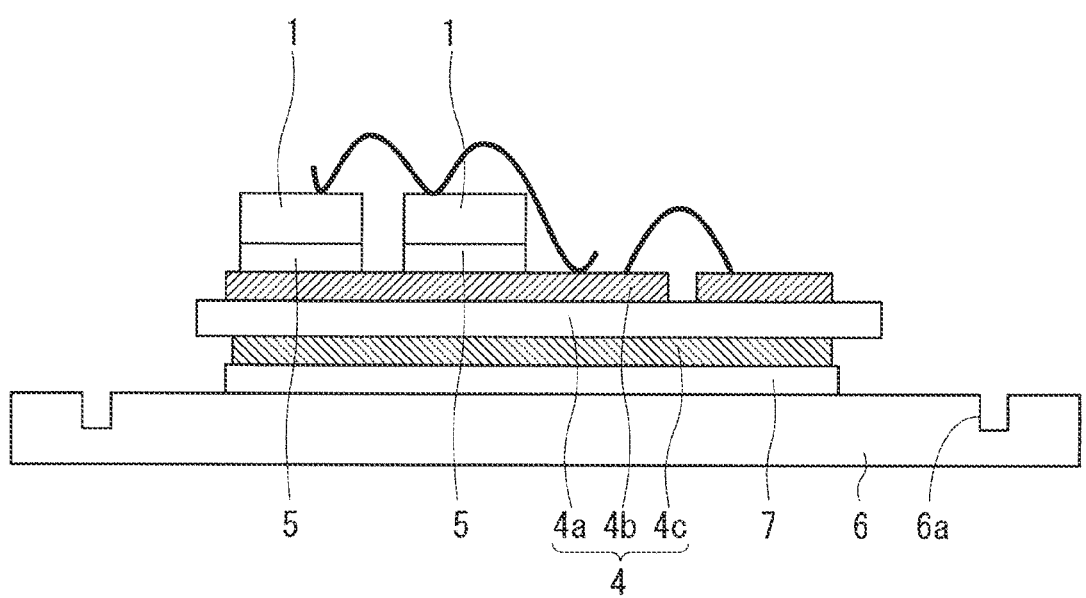
FIG. 11 is a schematic cross-sectional view illustrating a manufacturing process of the semiconductor device according to Embodiment 3.

A method of manufacturing the semiconductor device 100 of Embodiment 3 will be described. First, the base plate 6 having the groove 6a, the bonding material 7, the insulating substrate 4, the bonding material 5 and the semiconductor elements 1 are stacked in this order, and the reflow is performed under reduced pressure or in a reducing gas atmosphere, and a thermal history of the melting temperature of the bonding material 5 and the bonding material 7 or higher is given, thereby bonding each member together. Next, wiring is performed between the semiconductor elements 1 or between the semiconductor element 1 and the insulating substrate 4 by ultrasonic bonding of the metal wires 10. As a result, the configuration illustrated in FIG. 11 is obtained.

Figure 12:
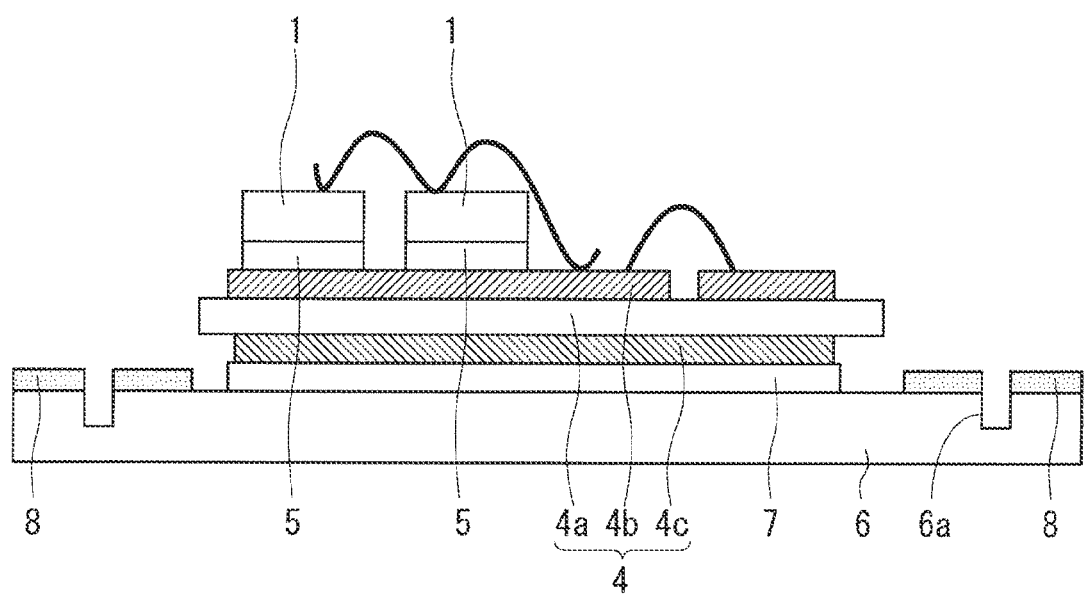
FIG. 12 is a schematic cross-sectional view illustrating a manufacturing process of the semiconductor device according to Embodiment 3.
Figure 13:
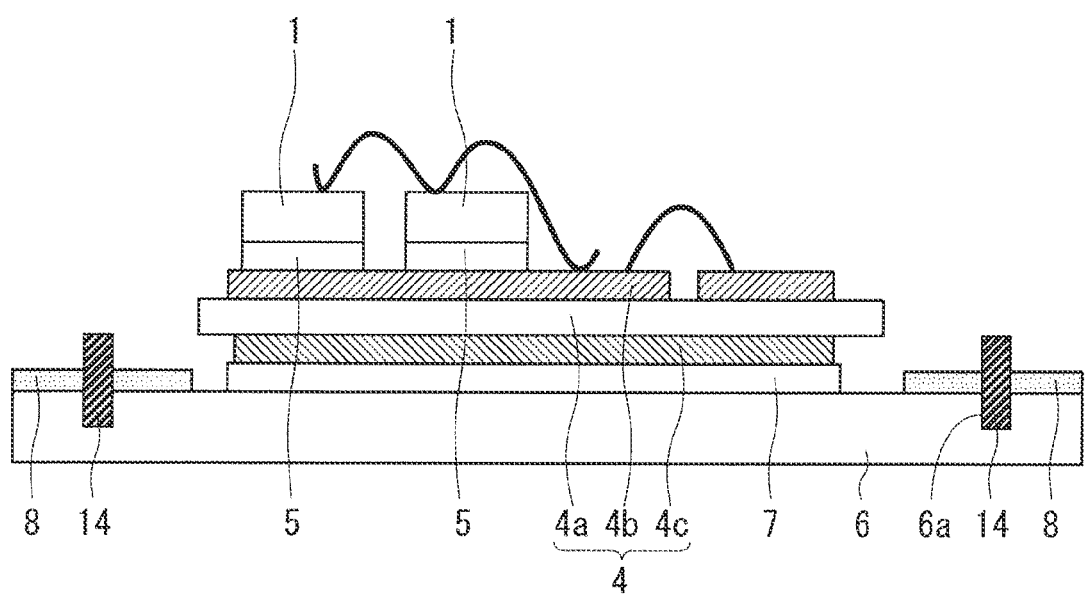
FIG. 13 is a schematic cross-sectional view illustrating a manufacturing process of the semiconductor device according to Embodiment 3.
Figure 14:
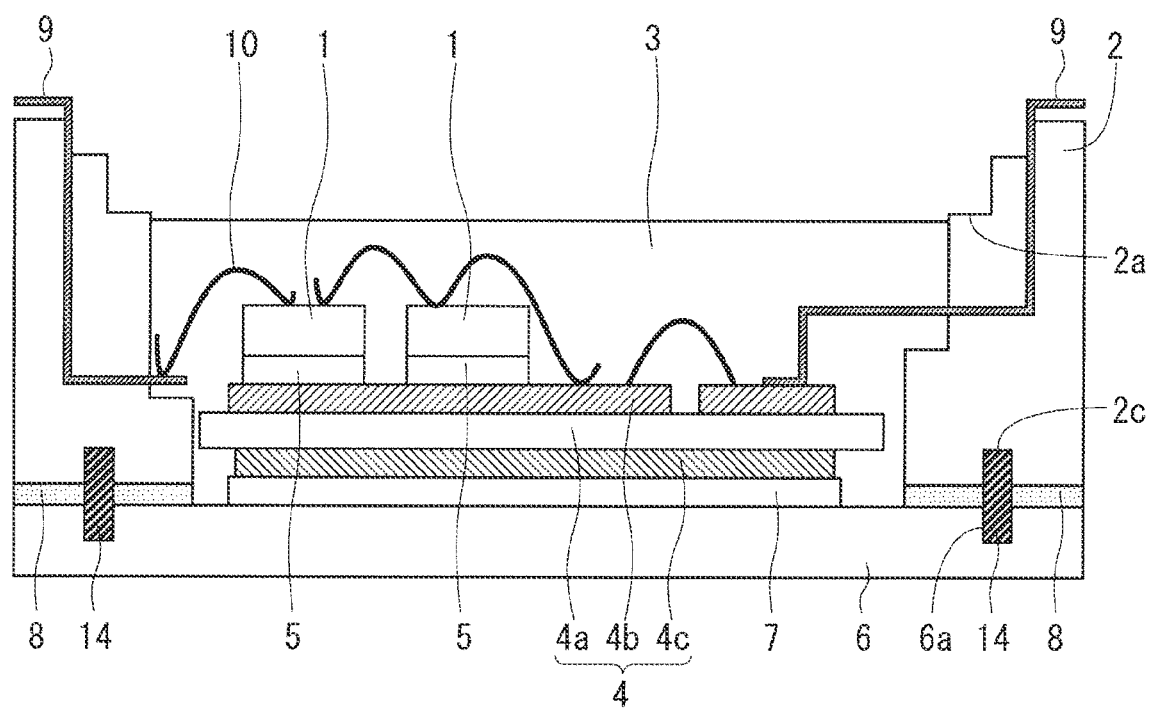
FIG. 14 is a schematic cross-sectional view illustrating a manufacturing process of the semiconductor device according to Embodiment 3.

Subsequently, as illustrated in FIG. 12, the adhesive 8 is linearly applied to both sides of the groove 6a in the outer peripheral portion (adhesive portion with the case 2) of the base plate 6. Further, as illustrated in FIG. 13, the low moisture permeable sheet 14 is placed on the base plate 6. At this point, the lower portion of the low moisture permeable sheet 14 is inserted into the groove 6a. Further, as illustrated in FIG. 14, the case 2 having the groove 2c is placed on the adhesive 8. At this point, the upper portion of the low moisture permeable sheet 14 is inserted into the groove 2c. Then, the adhesive 8 is subjected to thermosetting to adhere the base plate 6 and the case 2 together.

After that, as in Embodiment 1, the electrodes 9 incorporated in the case 2 are bonded to the semiconductor elements 1 or the insulating substrate 4, the semiconductor elements 1 are sealed with the sealing material 3, and after the sealing material 3 is covered with the low moisture permeable sheet 11, the lid 12 is adhered to the case 2. Through the processes, the semiconductor device 100 illustrated in FIG. 9 is completed.

According to the semiconductor device 100 of Embodiment 3, moisture absorption through the adhesive 8 between the case 2 and the base plate 6 is reduced; therefore, in addition to the effect same as that of Embodiment 1, the effect that the humidity absorption tolerance of the semiconductor device 100 can be further improved can be obtained.

Embodiment 4

Figure 15:
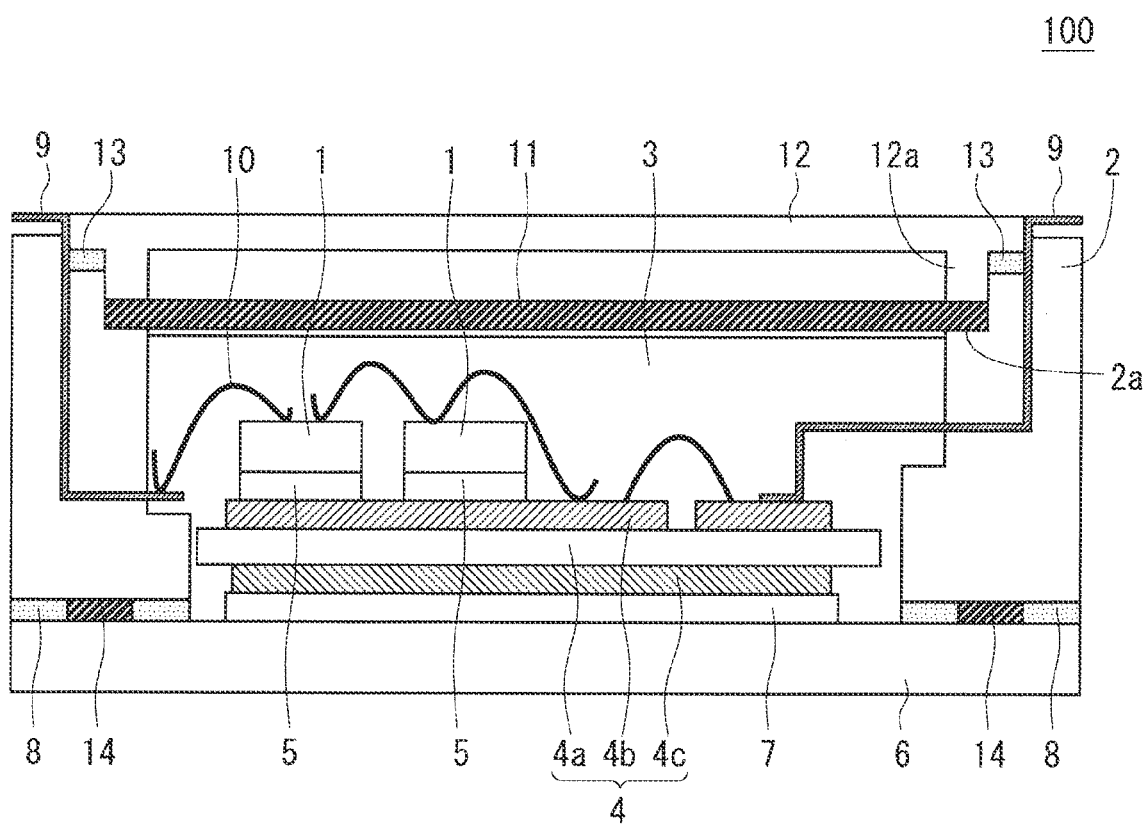
FIG. 15 is a schematic cross-sectional view of a semiconductor device according to Embodiment 4.

FIG. 15 is a schematic cross-sectional view of a semiconductor device 100 according to Embodiment 4. The configuration of the semiconductor device 100 according to Embodiment 4 is different from the configuration of Embodiment 3 (FIG. 9) in that the thickness of a low moisture permeable sheet 14 provided at an adhesive interface between a case 2 and a base plate 6 is the same thickness as that of an adhesive 8. The thickness of the low moisture permeable sheet 14 and the thickness of the adhesive 8 are the same; therefore, the groove 2c provided in the case 2 and the groove 6a provided in the base plate 6 in Embodiment 2 are not required to be provided, contributing to the improvement in the productivity and the reduction in processing cost.

Figure 16:
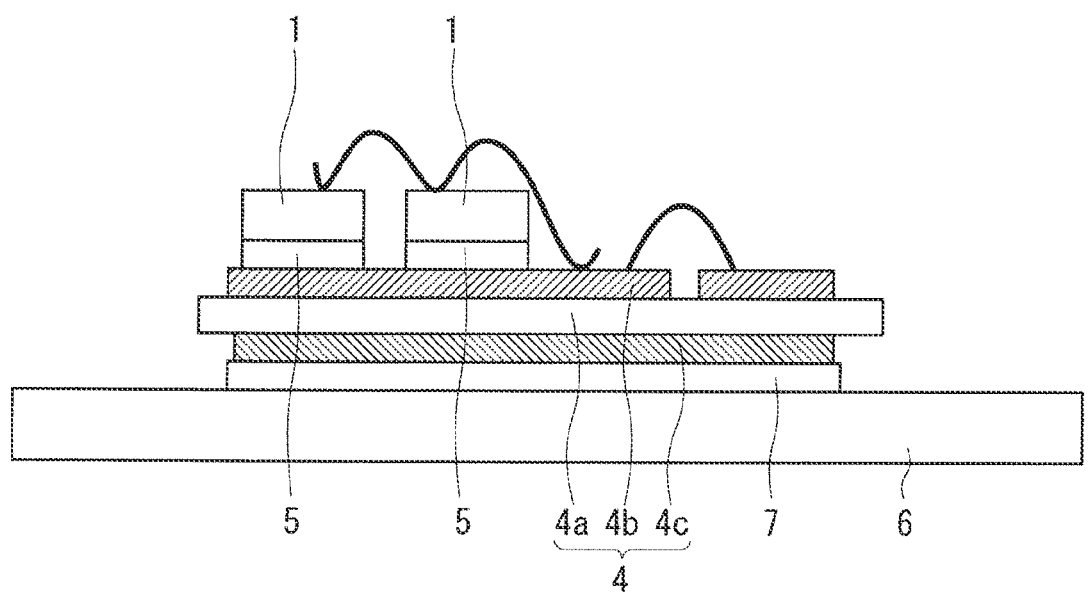
FIG. 16 is a schematic cross-sectional view illustrating a manufacturing process of the semiconductor device according to Embodiment 4.

A method of manufacturing the semiconductor device 100 of Embodiment 4 will be described. First, the base plate 6, the bonding material 7, the insulating substrate 4, the bonding material 5 and the semiconductor elements 1 are stacked in this order, and the reflow is performed under reduced pressure or in a reducing gas atmosphere, and a thermal history of the melting temperature of the bonding material 5 and the bonding material 7 or higher is given, thereby bonding each member together. Next, wiring is performed between the semiconductor elements 1 or between the semiconductor element 1 and the insulating substrate 4 by ultrasonic bonding of the metal wires 10. As a result, the configuration illustrated in FIG. 16 is obtained.

Figure 17:
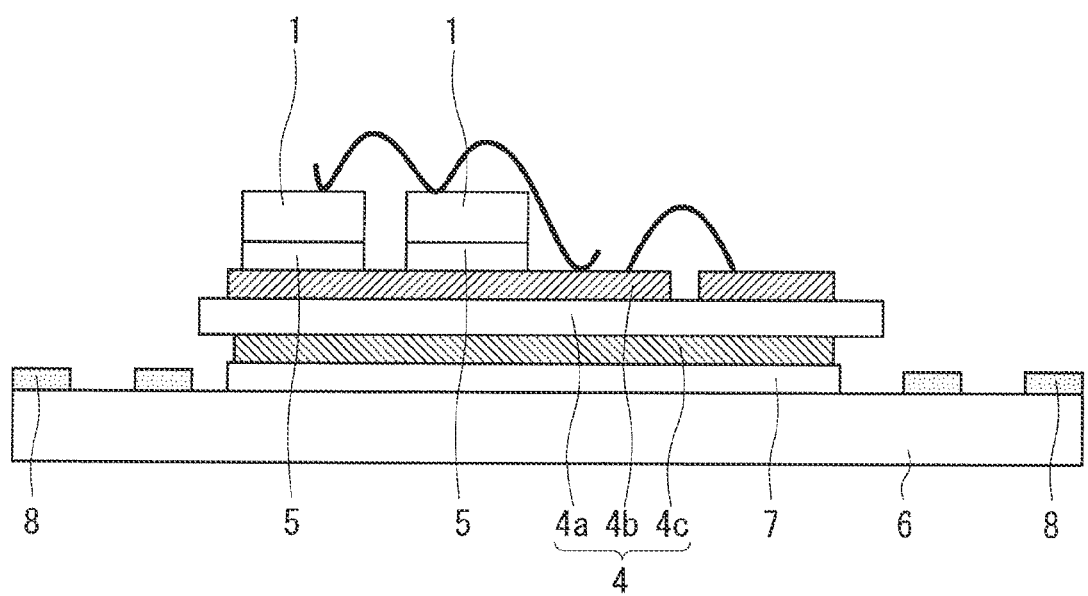
FIG. 17 is a schematic cross-sectional view illustrating a manufacturing process of the semiconductor device according to Embodiment 4.
Figure 18:
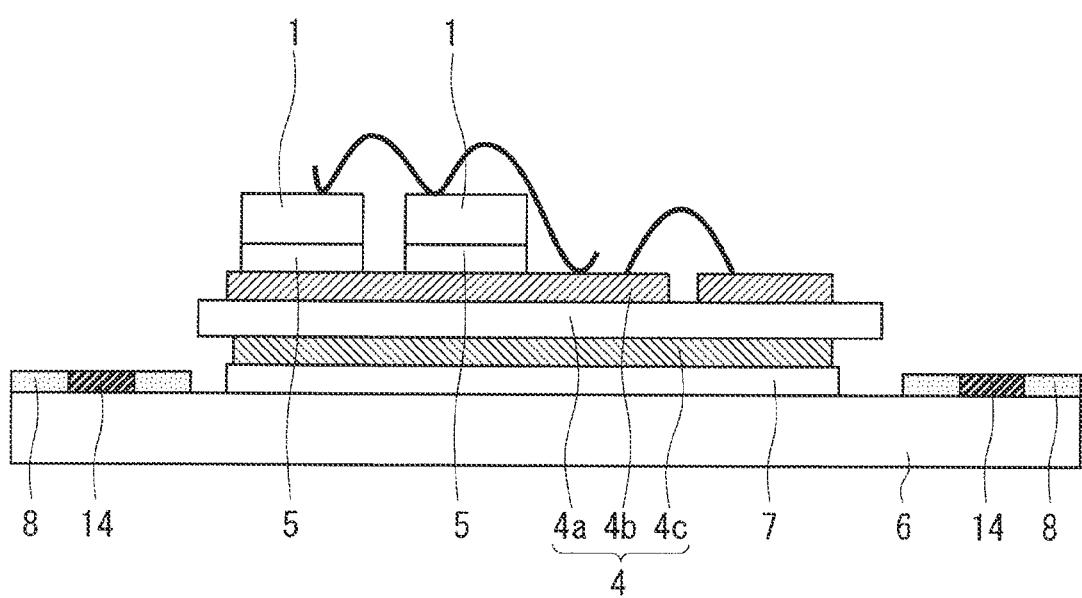
FIG. 18 is a schematic cross-sectional view illustrating a manufacturing process of the semiconductor device according to Embodiment 4.
Figure 19:
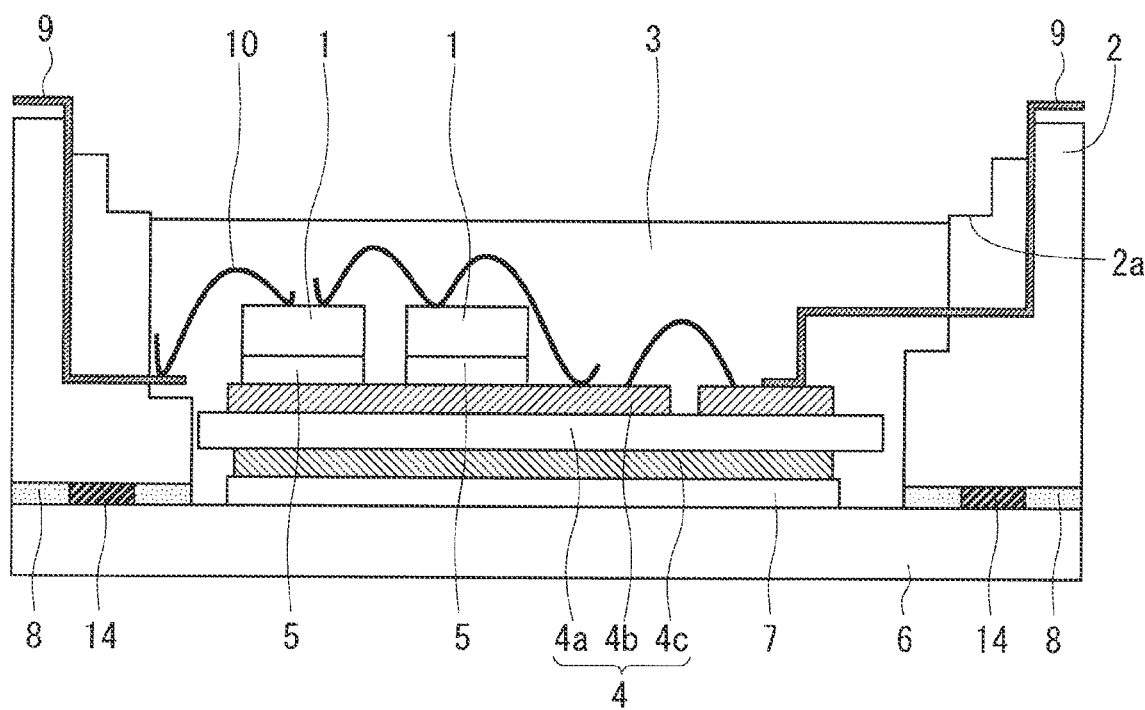
FIG. 19 is a schematic cross-sectional view illustrating a manufacturing process of the semiconductor device according to Embodiment 4.

Subsequently, as illustrated in FIG. 17, the adhesive 8 is linearly applied to both sides of the installation position of the low moisture permeable sheet 14 in the outer peripheral portion (adhesive portion with the case 2) of the base plate 6. Further, as illustrated in FIG. 18, the low moisture permeable sheet 14 is placed on the base plate 6. Unlike Embodiment 3, although no groove 6a for inserting the low moisture permeable sheet 14 is provided in the base plate 6, the position of the low moisture permeable sheet 14 is fixed by the paste-like adhesive 8. Then, as in FIG. 19, the adhesive 8 is placed on the case 2 and the adhesive 8 is subjected to thermosetting to adhere the base plate 6 and the case 2 together.

After that, as in Embodiment 1, the electrodes 9 incorporated in the case 2 are bonded to the semiconductor elements 1 or the insulating substrate 4, the semiconductor elements 1 are sealed with the sealing material 3, and after the sealing material 3 is covered with the low moisture permeable sheet 11, the lid 12 is adhered to the case 2. Through the processes, the semiconductor device 100 illustrated in FIG. 15 is completed.

The embodiments can be combined, appropriately modified or omitted.

While the disclosure has been shown and described in detail, the foregoing description is in all aspects illustrative and not restrictive. It is therefore understood that numerous modifications and variations can be devised.

What is claimed is:

1. A semiconductor device comprising:
   a semiconductor element;
   a case housing the semiconductor element;
   a sealing material filled in the case in which the semiconductor element is housed;
   a first low moisture permeable sheet made of a low moisture permeable material having moisture permeability of 1 $g/m^2 \times 24$ Hr or less and covering the sealing material; and
   a lid covering an opening of the case, wherein
   a peripheral edge of the first low moisture permeable sheet is interposed between the case and the lid.

2. The semiconductor device according to claim 1, wherein
   the case has a counterbore portion on a peripheral edge of the opening,
   the lid has a convex portion fitted to the opening of the case, and
   the first low moisture permeable sheet is interposed between the counterbore portion of the case and the convex portion of the lid.

3. The semiconductor device according to claim 1, wherein
   the case and the lid are adhered to each other using a first adhesive at a portion where the first low moisture permeable sheet is not interposed therebetween, and a thickness direction of the first adhesive is the same as a thickness direction of the first low moisture permeable sheet in a portion where the first low moisture permeable sheet is interposed between the case and the lid.

4. The semiconductor device according to claim 1, wherein
the first low moisture permeable sheet has a convex portion interposed between the case and the lid, and
the case has a groove into which the convex portion of the first low moisture permeable sheet is inserted.

5. The semiconductor device according to claim 1, wherein
the case is adhered to a base plate on which the semiconductor element is mounted using a second adhesive, and
the semiconductor device further comprises a second low moisture permeable sheet made of a low moisture permeable material having moisture permeability of 1 g/m$^2$×24 Hr or less and extending in an adhesive interface between the case and the base plate.

6. The semiconductor device according to claim 5, wherein
the second adhesive is provided on both sides of the second low moisture permeable sheet in the adhesive interface between the case and the base plate.

7. The semiconductor device according to claim 5, wherein
the case and the base plate have grooves, respectively, into which parts of the second low moisture permeable sheet are inserted.

8. The semiconductor device according to claim 5, wherein
a thickness of the second low moisture permeable sheet is the same as a thickness of the second adhesive.

9. The semiconductor device according to claim 1, wherein
irregularities are provided on a surface of the first low moisture permeable sheet.

10. The semiconductor device according to claim 1, wherein
the low moisture permeable material is a fluororesin.

* * * * *